(12) United States Patent
Taheri et al.

(10) Patent No.: US 7,342,836 B2
(45) Date of Patent: Mar. 11, 2008

(54) ONE TIME PROGRAMMABLE LATCH AND METHOD

(75) Inventors: Babak Taheri, San Francisco, CA (US); Sanjeev Maheshwari, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 207 days.

(21) Appl. No.: 11/234,429

(22) Filed: Sep. 23, 2005

(65) Prior Publication Data

US 2006/0114020 A1    Jun. 1, 2006

Related U.S. Application Data

(60) Provisional application No. 60/613,179, filed on Sep. 24, 2004.

(51) Int. Cl.
*G11C 7/00*    (2006.01)

(52) U.S. Cl. .................. 365/189.05; 365/189.07; 365/225.7; 365/210

(58) Field of Classification Search ........... 365/189.05, 365/189.07, 225.7, 210
See application file for complete search history.

(56) References Cited

U.S. PATENT DOCUMENTS

| | | | |
|---|---|---|---|
| 5,315,177 A | 5/1994 | Zagar et al. | |
| 5,734,617 A | 3/1998 | Zheng | |
| 5,812,477 A | 9/1998 | Casper et al. | |
| 5,875,144 A | 2/1999 | Zheng | |
| 5,978,298 A | 11/1999 | Zheng | |
| 5,986,932 A | 11/1999 | Ratnakumar et al. | |
| 6,011,742 A | 1/2000 | Zheng | |
| 6,016,264 A | 1/2000 | Lin | |
| 6,084,814 A | 7/2000 | Casper et al. | |
| 6,097,618 A | 8/2000 | Jenne | |
| 6,122,191 A | 9/2000 | Hirose et al. | |
| 6,125,069 A * | 9/2000 | Aoki ..................... | 365/225.7 |
| 6,181,627 B1 | 1/2001 | Casper et al. | |
| 6,384,664 B1 * | 5/2002 | Hellums et al. ........... | 327/525 |
| 6,420,925 B1 | 7/2002 | Fifield et al. | |
| 6,469,930 B1 | 10/2002 | Murray | |
| 6,553,556 B1 | 4/2003 | Blodgett | |
| 6,608,498 B2 * | 8/2003 | Khoury ..................... | 324/765 |
| 6,621,324 B2 | 9/2003 | Fifield et al. | |
| 6,633,506 B2 | 10/2003 | Casper et al. | |
| 6,741,117 B2 | 5/2004 | Lee | |
| 6,759,895 B2 | 7/2004 | Takami | |
| 6,983,404 B2 * | 1/2006 | Cutter et al. ............... | 714/721 |
| 7,146,585 B2 | 12/2006 | Blodgett | |
| 7,149,114 B2 | 12/2006 | Taheri et al. | |

* cited by examiner

*Primary Examiner*—Son Dinh
(74) *Attorney, Agent, or Firm*—Haverstock & Owens, LLP

(57) ABSTRACT

A one-time programmable (OTP) latch circuit can include a single OTP device capable of storing a logic value in a nonvolatile fashion, or only two OTP devices in the event redundancy is desired. A latch section can latch a data value based on a comparison between a current drawn according to the one OTP device, and a reference current generated without and OTP device. An OTP device can include a gate oxide antifuse (GOAF) device.

19 Claims, 10 Drawing Sheets

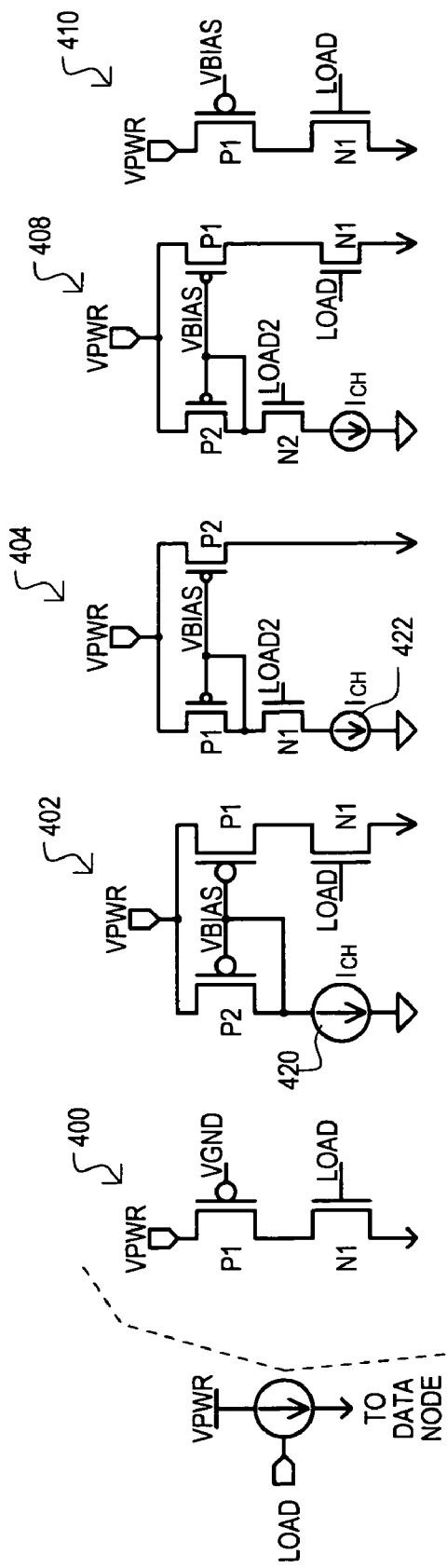
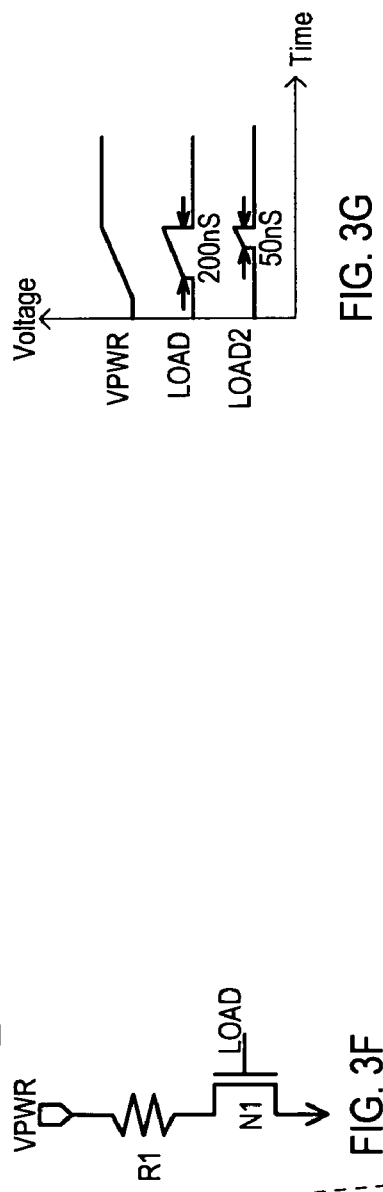

(LOAD OPERATION)

ONE TIME PROGRAMMABLE LATCH AND METHOD

This application claims the benefit of U.S. Provisional Patent Application Ser. No. 60/613,179, filed on Sep. 24, 2004.

TECHNICAL FIELD

The present invention relates generally to latch circuits and more particularly to latch circuits that can operate in conjunction with nonvolatile storage elements.

BACKGROUND OF THE INVENTION

Electronic systems can typically include a data storage capability. For example, bi-stable circuits, such as flip-flops can maintain a data value in one of two binary logic values depending upon an input to the flip-flop. One commonly used bi-stable circuit that can maintain a logic value until another value is written or rewritten is a latch.

A latch can take a number of different forms. For example, a latch can include cross-coupled inverters that can latch a data value on complementary data nodes until a new data value is rewritten. Such latches are often used as static random access memory (SRAM) cells. An SRAM type latch can store true and complementary logic values sent to the latch from, as but one example, a data bus. Such stored data values can be read when an execution unit fetches (e.g. reads) data from an addressed storage cell.

Unlike memory cells that can require periodic refresh (i.e., dynamic random access memory (DRAM) cells), an SRAM type latch can retain stored data without requiring refresh until such a time as power is removed from the latch. However, there are many applications in which it is desirable for a data value to be retained even in the absence of power. As but one example, in some systems read-only-memory (ROM) storage media can be used to store software in applications that do not readily change or are needed as a boot-up driver. Even more particularly, a ROM is often used as part of a basic input/output system (BIOS) code, and can be used in look-up tables and character generators.

Once programmed, how a ROM can maintains a programmed state can vary according to the type of ROM used. Generally speaking, a ROM can utilize a non-volatile storage element. As is well known, a non-volatile storage element can maintain a stored logic value after power is removed from the circuit. Conversely, a volatile storage element will lose a stored data value once power is removed.

Latch circuits are typically understood to be volatile circuits. On the other hand, masked ROMs or field programmable ROMs (PROMs) are a form of nonvolatile memory. Other types of nonvolatile memories include electrically programmable ROMs (EPROMs) and electrically erasable programmable ROMs (EEPROMs).

Generally, the primary difference between a PROM and EPROM (or EEPROM) is that the former can be generally programmed only once, and thereafter cannot be erased. The latter can be erased through the application of ultraviolet light or electrical erasure. "Flash" memory is a type of EEPROM that can be utilized for applications requiring both nonvolatility as well as erasure.

Electronic subsystems can often include both volatile and nonvolatile memory. Typically, a volatile memory is situated within an integrated circuit that is separate and apart from an integrated circuit including a nonvolatile memory. There may be instances, however, where both volatile and non-volatile storage elements are included in the same integrated circuit. In such instances, data targeted for volatile storage elements is generally altogether different from the data targeted for the volatile storage elements. For example, the different data sets may be for different applications.

It would be desirable to arrive at a storage device having both volatile and nonvolatile features for the same data value. For example, if data is to be temporarily held while power is present, a storage device can utilize a latch into which data can be written and thereafter read. However, if the data stored is of sufficient importance, the data could be maintained after power is removed by storing the data value into a nonvolatile storage element. Such a desired storage device could functional essentially as a latch, but also include nonvolatile storage for latched data, and thus can represent an improvement over conventional storage devices that are dedicated as either a latch or nonvolatile storage, but not both. Such a circuit can be considered a "programmable" latch circuit.

To better understand various aspects of the disclosed embodiments of the present invention, two examples of conventional programmable latches will first be described A first conventional programmable latch is set forth in FIG. 11 in a schematic diagram and designated by the general reference character 1100. A programmable latch circuit 1100 can include a volatile latch section 1102, a read/write multiplexer section 1104, and a nonvolatile storage section 1106. A volatile latch 1102 can store a data value in response to a write operation, and output data in response to a read operation. A multiplexer section 1104 can enable data to be loaded from a nonvolatile storage (read) section 1106 into volatile section 1102, and can enable data stored (write) in volatile section 1102 to be programmed into nonvolatile storage section 1104.

In the particular example of FIG. 11, nonvolatile storage section 1106 can utilize silicon-oxide-nitride-oxide-silicon (SONOS) type nonvolatile storage elements. SONOS type nonvolatile storage elements can be programmed to opposite states (e.g., conducting or non-conducting when a particular gate voltage is applied). In a load operation, the nodes of the latch can be equalized. The oppositely programmed SONOS devices can draw latch nodes to different potentials after the latch nodes are released from equalization. Thus, a data value established by the SONOS storage elements can be latched within latch section 1102.

In this way, a programmable latch can include multiple nonvolatile storage elements that store a data value, which can be latched into a volatile latch circuit.

A second conventional programmable latch is set forth in FIG. 12 in a schematic diagram and designated by the general reference character 1200. A programmable latch circuit 1200 can include a volatile latch section 1202, a multiplexer section 1204, and a nonvolatile storage section 1206. Unlike the arrangement of FIG. 11, second conventional programmable latch 1200 can be "one-time" programmable (OTP). That is, the programmable latch 1200 can utilize nonvolatile storage elements that can be programmed but once (OTP devices). In very particular example of FIG. 12, a nonvolatile storage section 1206 can include gate oxide anti-fuse (GOAF) devices 1208. In particular, GOAF devices 1208 can each be part of a three transistor (3T GOAF) cell 1210 (also referred to as a two-transistor one-cell "2T-1C" memory cell).

A drawback to the above conventional arrangements can be the area needed to implement such circuits. In particular, in order to establish complementary values at volatile latch nodes, two nonvolatile devices are utilized, and the nonvolatile devices are typically large devices. In particular, in the case of SONOS type devices, because a relatively large programming current is needed (e.g., 1 mA), relatively large device sizes are needed to supply such current to the SONOS devices. In the case of GOAF devices, a GOAF cell can occupy 30% to 40% of the programmable latch circuit.

The above drawbacks are exacerbated by the need, in some applications, for redundancy in the programmable devices. In particular, to implement full redundancy, four nonvolatile elements would have to be included, further increasing the size of the programmable latch.

In light of the above, it would be desirable to arrive at a one-time programmable latch circuit that has a smaller size than the above conventional approaches.

SUMMARY OF THE INVENTION

The present invention can include a programmable latch circuit that includes a one-time programmable (OTP) device capable of being programmed only once to store a logic value, a current source that provides a current reference and does not include an OTP device, and a store circuit that stores a predetermined logic value based on a comparison between a current drawn in response to the OTP device and the reference current.

In such an arrangement, a programmable latch can include but one OTP device to store a value in a nonvolatile fashion, and load such value into a store circuit, such as latch. This can result in an advantageously compact circuit as compared to approaches that utilize two OTP devices.

According to one aspect of the embodiment, an OTP device can include a gate oxide anti-fuse device. Use of such an OTP device can further allow for a compact circuit size and avoid the need for large devices capable of providing a programming current, as in the case of other nonvolatile storage elements.

According to another aspect of the embodiments, a store circuit can include a latch circuit that stores a predetermined logic value and includes at least two latch nodes that store complementary logic values. A read out amplifier can be coupled to at least one of the latch nodes, and can amplify the logic value at the latch node. One or more pass devices can be coupled to at least one of the latch nodes, and can provide a path for writing data to the latch circuit.

In this way, data loaded into a latch circuit can be read out. Further, data can be written into the latch circuit to enable programming of an OTP device.

According to another aspect of the embodiments, a current source can include any of a number of circuits, such as: a transistor pair that includes a first transistor in series with a second transistor, the first transistor being coupled to a power supply and the second transistor being enabled by a load signal that is active when a data value is loaded from the OTP device; a transistor pair that includes a first transistor in series with a second transistor, the first transistor being coupled to a bias voltage at a level between power supply voltages, the second transistor being enabled by a load signal that is active when a data value is loaded from the OTP device; a current mirror having a load transistor coupled in series with one of the current mirror legs, the load transistor being enabled by a load signal that is active when a data value is loaded from the OTP device; a current mirror having load transistors coupled in series with both of the current mirror legs, the load transistors being enabled by a load signal that is active when a data value is loaded from the OTP device; and a resistor in series with a load transistor, the load transistor being enabled by a load signal that is active when a data value is loaded from the OTP device control.

In this way, a reference current could be generated in a variety of ways.

According to another aspect of the embodiments, a current source and a store circuit can comprise insulated gate field effect transistors. An OTP circuit can include the OTP device and a high voltage transistor. The high voltage transistor can include a gate insulator that is more resistant to high voltage breakdown than the transistors of the current source and store circuit.

In this way, an OTP circuit can include a high voltage device that can isolate a high voltage section of an OTP latch circuit (e.g., programmed section) from lower voltage sections (e.g., latch section).

According to another aspect of the embodiments, a store circuit can have a latch circuit that stores a predetermined logic value and includes at least two latch nodes that store complementary logic values. An OTP circuit can include an OTP device, a high voltage transistor, and a programming transistor. A source-drain path of the high voltage transistor can be coupled between the OTP device and one of the latch nodes. A source-drain path of the programming transistor can be coupled between the high voltage transistor and a low power supply node.

In this way, a programming path can be created for an OTP device.

According to another aspect of the embodiments, a programmable latch circuit can further include a redundant OTP (R-OTP) device capable of being programmed only once to store a logic value, the R-OTP device being arranged in parallel with the OTP device, and not being programmed to match the state of the OTP device if the OTP device is not defective.

In this way, a programmable latch circuit can have redundancy capabilities with as few as two OTP devices.

The present invention can also include a one time programmable latch having a latch circuit with cross-coupled data nodes that store a logic value, a current source circuit, and a one time programmable (OTP) device. A current source circuit can be coupled to a first data node and can supply a first current to a first data node in response to a load signal. A current source circuit is not controlled according to any nonvolatile storage device. An OTP device can draw essentially no current in a first state and a leakage current in the second state. Further, the OTP device can be coupled to a second data node in response to a load signal.

According to one aspect of the embodiments, a latch circuit can include a pair of latch transistors cross-coupled between the data nodes, as well as a pair of hold transistors. A first hold transistor can have a source-drain path coupled between a first data node and a first supply voltage. A second hold transistor can have a source-drain path coupled between a second data node and the first supply voltage. Gates of the first and second hold transistors can be commonly coupled to receive a hold signal.

In such an arrangement, a latch circuit can have a latching function that is disabled in response to a hold signal prior to a loading data from an OTP device. After the state of that latch is set with an OTP device coupled to only one node, the latching function can be enabled. In this way, data can be loaded from but one OTP device.

According to another aspect of the embodiments, a latch circuit can further include a pair of equalization transistor. A first equalization transistor can have a source-drain path coupled between the first data node and a second supply voltage. A second equalization transistor can have a source-drain path coupled between the second data node and the second supply voltage. A gate of the first and second equalization transistors can be commonly coupled to receive an equalization signal.

In such an arrangement, data nodes can be equalized to a same voltage to better condition a latch circuit for a data load operation from the one OTP device.

According to another aspect of the embodiments, a high voltage transistor can have a source-drain path coupled between the OTP device and a second data node.

According to another aspect of the embodiments, a programming transistor can have a source-drain path coupled between the high voltage transistor and a second supply voltage, and gate coupled to one of the data nodes.

According to another aspect of the embodiments, a program enable transistor can have a source-drain path coupled between the gate of the programming transistor and the one of the data nodes.

According to another aspect of the embodiments, an OTP load transistor can have a source-drain path coupled between the OTP device and the second data node. A current source load transistor can have a source-drain path coupled between the current source circuit and the first data node. Gates of the OTP load transistor and current source load transistor can be commonly coupled to receive a load signal.

In this way, the same load signal can provide a reference current and an OTP current to a latch circuit.

The present invention can also include a method of programmable latching. The method can include establishing a state of a one time programmable (OTP) device to provide a programmed current value representing a predetermined logic value. The method can further include providing a reference current that is not generated from an OTP device, and latching a data value based on a difference between the programmed current and the reference current.

In this way, data can be set in a latch based on one OTP device state.

According to one aspect of the embodiments, establishing the state of the OTP device can include, to store one logic value, creating a short in a gate insulator of a gate oxide antifuse (GOAF) device to thereby draw a leakage current. To store another logic value, the gate insulator of the GOAF device is not changed, and the GOAF device draws essentially no current.

According to another aspect of the embodiments, providing a reference current can include providing a reference current that is less than a leakage current drawn by a programmed GOAF device.

According to another aspect of the embodiments, providing a reference current can include biasing a transistor.

In this way the use of two OTP devices to establish the state of a latch can be avoided.

According to another aspect of the embodiments, a method can further include, when programming one state of the OTP device, writing one data value to a latch, and enabling a programming potential to the OTP device when the latch stores a particular data value.

In this way, an OTP device can be programmed according to a latched data value.

According to another aspect of the embodiments, providing the reference current can include generating the reference current from a digital value.

BRIEF DESCRIPTION OF THE DRAWINGS

FIGS. 3A to 3F are schematic diagrams of current source circuits that can be included in embodiments of the present invention. FIG. 3G is a timing diagram showing examples of signal activation times for the circuits of FIGS. 3A to 3F.

DETAILED DESCRIPTION

The various embodiments of the present invention are directed to a programmable latch circuit and method. Smaller circuit sizes can be achieved as but one programmable element can be utilized in embodiments for which redundancy is not included, or only two programmable elements in the event redundancy is included.

Figure 1:
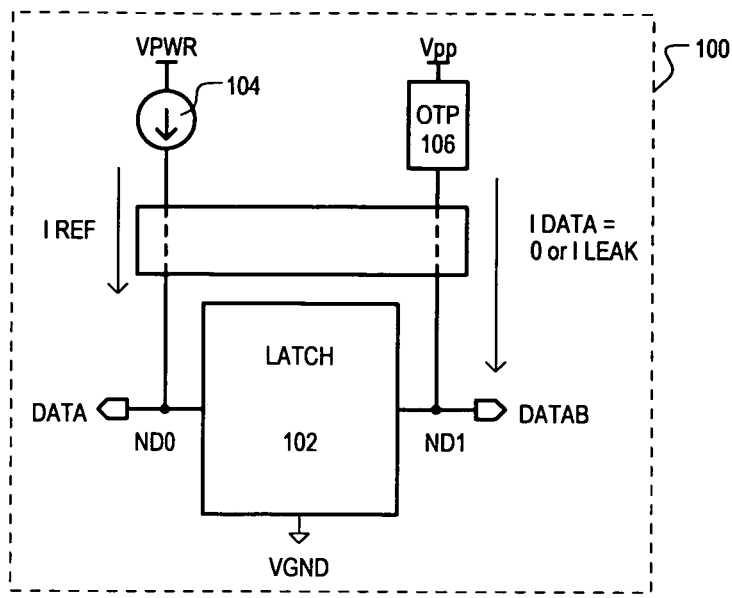
FIG. 1 is a block diagram of a one-time programmable (OTP) latch circuit according to a first embodiment of the present invention.

Referring now to FIG. 1, a programmable latch circuit according to a first embodiment is set forth in a block schematic diagram and designated by the general reference character 100. The programmable latch circuit can be a one-time programmable (OTP) latch circuit, and can include a latch section 102, a current source circuit 104, and an OTP circuit 106. A latch circuit 102 can be a volatile storage circuit that can latch a data value DATA. For example, a latch circuit 102 can provide complementary data values DATA and DATAB on complementary data nodes ND0 and ND1.

A current source circuit 104 can provide a reference current IREF to latch circuit 102. In one embodiment, the magnitude of a reference current IREF can be greater than a current drawn by an OTP circuit 106 when storing one state, but less than a current drawn by an OTP circuit 106 when storing a second state. A current source circuit 104 does not utilize any nonvolatile device to generate the reference circuit.

An OTP circuit 106 can be programmed into one of at least two states. Such a circuit may be one-time programmable. That is, once the circuit has been programmed into a particular state, it remains in such a state (i.e., it is not erasable). Preferably, an OTP circuit 106 can include an OTP device and associated circuitry for programming the OTP device. Even more preferably, an OTP circuit can include a gate oxide antifuse (GOAF) device, and circuits that enable a programming voltage to be applied between a gate structure and commonly connected source-drain structures.

As noted above, in one state (i.e., not programmed), an OTP circuit 106 can draw a first current value (e.g., essentially no current) that is less than a reference current provided by current source circuit 104. In another state (i.e., programmed), an OTP circuit 106 can draw a leakage current value that is greater than a reference current provided by current source circuit 104.

In this way, a differential current draw generated by an OTP device and current source circuit can cause a data value to be latched in a latch circuit. It is noted that only one OTP device can be included resulting in a more compact circuit than conventional arrangements that rely on two such devices.

Figure 2:
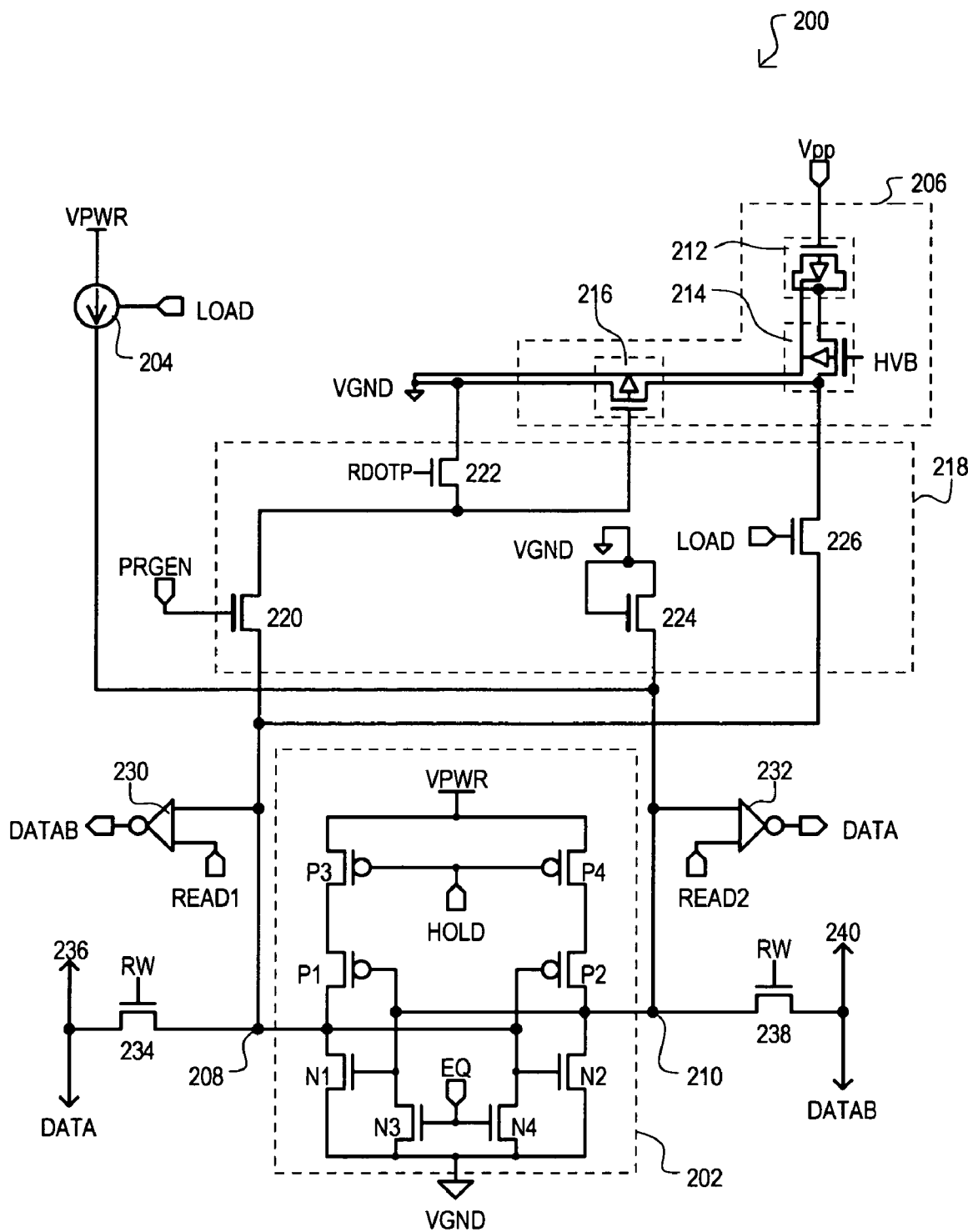
FIG. 2 is a schematic diagram of an OTP latch circuit according to a second embodiment of the present invention.

A one-time programmable (OTP) latch circuit according to a second embodiment is set forth in FIG. 2, and designated by the general reference character 200. An OTP latch circuit 200 can be considered related to that of FIG. 1, in that FIG. 2 can represent a particular implementation of general circuit set forth in FIG. 1. An OTP latch circuit 200 can include a latch section 202, a current reference circuit 204, an OTP circuit 206, and a load/program circuit 218.

A latch section 202 can include n-channel insulated gate field effect transistors (NFET(NMOS)s) N1 and N2 cross-coupled between data nodes 208 and 210. Similarly, p-channel insulated gate field effect transistors (PFETs) P1 and P2 can be cross-coupled between data nodes 208 and 210. Looked at in another way, latch circuit 202 can include cross-coupled inverters N1/P1 and N2/P2.

A latch circuit 202 can further include "hold" PFETs P3 and P4. Hold PFET P3 can have a source-drain path coupled between data node 208 and a high supply voltage VPWR, and hold PFET P4 can have a source-drain path coupled between data node 210 and high supply voltage VPWR. The gates of PFETs P3 and P4 can commonly receive a hold signal HOLD. In addition, a latch section 202 can include equalization NFET(NMOS)s N3 and N4. Equalization NFET(NMOS) N3 can have a source-drain path coupled between data node 210 and a low supply voltage VGND, and equalization NFET(NMOS) N4 can have a source-drain path coupled between data node 208 and low supply voltage VGND. The gates of NFET(NMOS)s N3 and N4 can commonly receive an equalization signal EQ.

A current reference circuit 204 can be connected between a high voltage VPWR and data node 210, and can provide a reference current $I_{REF}$. In the particular example shown, a current reference circuit 204 can be enabled in response to a signal LOAD. That is, when signal LOAD is not active, current reference circuit can provide essentially no current. However, when signal LOAD is active, current reference circuit can provide reference current $I_{REF}$. Particular examples possible types of circuits that can be used as a current reference circuit 204 will be described in more detail below.

An OTP circuit 206 can include an OTP device 212, a high voltage transistor 214, and a programming transistor 216. In the particular example of FIG. 2, an OTP device 212 can be a gate oxide antifuse (GOAF) device. As is well understood, a GOAF device can include a gate structure separated from a substrate by a gate insulator (referred to herein generally as an oxide). In an unprogrammed state, a gate insulator can remain intact. Thus, when a potential is applied between the gate and the substrate, a leakage current can be essentially zero. In contrast, in a programmed state a short can be created through the gate insulator. Thus, when a potential is applied between the gate and the substrate, a leakage current can result. A high voltage transistor 214 can be a transistor designed to withstand a relatively high potential between its gate and source/drain. As but one example, a high voltage transistor can have a thicker gate insulator than other devices of the circuit.

An OTP device 212 can have a gate structure coupled to receive a programming voltage Vpp and source/drain structures commonly connected to a drain of high voltage transistor 214. A high voltage transistor 214 can have a source-drain path coupled between OTP device 212 and a drain of programming transistor 216. Programming transistor 216 can have a source-drain path coupled between high voltage transistor 214 and a low supply voltage VGND.

A load/program circuit 218 can provide various paths between OTP circuit 206 and latch section 202. In the arrangement of FIG. 2, a load/program circuit 218 can include a program enable device 220, a read OTP device 222, a dummy device 224, and a data load device 226. In one particular arrangement, a program enable device 220 can include a high voltage transistor having a source-drain path connected between data node 208 and a gate of programming device 216, and a gate that receives a program enable signal PRGEN. A read OTP device 222 can include a transistor having a source-drain path connected between a low power supply voltage VGND and a drain of program enable device 220, and can receive a signal RDOTP at its gate. A dummy device can be a "diode" connected transistor coupled between node 210 and a low power supply VGND. A data load device 226 can be a transistor having a source-drain path connected between high voltage transistor 214 and data node 208, and gate that receives a load signal LOAD.

Referring still to FIG. 2, the arrangement of FIG. 2 shows a circuit in which data can be written to a latch, and read from a latch via both data nodes 208 and 210. Accordingly, the OTP latch circuit 200 includes a first read amplifier 230 coupled to data node 208 and a second read amplifier 232 coupled to data node 210. Read amplifiers (208 and 210) can be enabled in response read signals READ1 and READ2, respectively. It is noted that READ1 and READ2 can be the same signal, in the event differential data reads are desired, or can be different signals in the event "single ended" reading is desired.

In a similar fashion, to receive write data and/or provide read data, the embodiment of FIG. 2 includes a first pass device 234 coupled to a first bitline 236, and a second pass device 238 coupled to a second bitline 240. In this way, a data value can be written to or read from a latch circuit 202 by enabling pass devices 234 and 238. In the case of a write operation, a differential voltage can be driven between bit lines 236 and 240. In the case of a read operation, a differential voltage generated between bit lines 236 and 240 can be amplified.

Of course, such data write and read operations to latch section 202 can also be "single ended" in alternate embodiments. Further, if data is read from one or both bitlines in conjunction with read amplifiers 230 and 232, read accesses can be "dual port".

As noted above, a current reference circuit, like that shown as 204 in FIG. 2, can take a variety of forms. A few of the possible implementations of such a current reference circuit are shown in schematic diagrams in FIGS. 3A to 3E.

These circuits represent but examples possible current reference circuits, and so should not be considered limiting to the present invention.

Each of the current reference circuits of FIG. 3A to 3F can include a current source transistor P1 and a data load transistor N1. In FIG. 3A, a current source transistor P1 can have gate connected to a low supply voltage VGND, and thus can operate in strong inversion. A data load transistor N1 can receive a LOAD signal that is active high. One skilled in the art would recognize that in the circuit of FIG. 3A, transistor P1, N1, or both, can be sized and/or doped to arrive at a desired reference current value.

FIG. 3B shows an arrangement in which current source transistor P1 forms part of a current mirror P1/P2. A data load transistor N1 can be situated in one leg of the current mirror. Optionally, in the event self-biasing of the p-channel transistors P1/P2 is not sufficient to generate a desired current value, a current supply circuit 420 can be situated in the other leg of the current mirror.

FIG. 3C shows another arrangement in which current source transistor P1 forms part of a current mirror P1/P2. A data load transistor N1 can be situated in one leg of the current mirror with the reference current being provided by the other leg. Optionally, in the event self-biasing of the current mirror is not sufficient, a current supply circuit 422 can be situated in series with data load transistor N1.

FIG. 3D shows an arrangement that can include the same essential components as FIG. 3B. However, the circuit 406 may additionally include a second data load transistor N2 in the current mirror leg opposite that of the first load transistor. Second load transistor can receive a second load signal LOAD2. Such an arrangement can provide an advantageously low standby current, as both legs of the current mirror P1/P2 can be turned off when data is not being loaded.

FIG. 3E shows an arrangement that can include the same essential components as FIG. 3A. However, current source transistor P1 can receive a bias voltage VBIAS to control the amount of current provided when data load transistor N1 is enabled.

FIG. 3F shows an arrangement that can include the same essential components as FIG. 3A. However, a resistor R1 can be used in the place of the current source transistor P1.

Finally, in other embodiments a reference circuit can be digitally programmable. For example, a current source digital-to-analog converter (DAC) can be utilized to generate a reference current. Such an arrangement can result in improved overall yield to account for variations in OTP leakage current arising from process and other variations. Current DAC types and approaches are well understood by those skilled in the art.

FIG. 3G shows a timing diagram for signals LOAD and LOAD2 (shown in FIG. 3D only). As shown, transistor N1 can first be enabled, followed by transistor N2. Of course the particular signal durations shown represent but one example, and can vary according to the particular implementation.

Having described detailed examples of an embodiment in FIGS. 2 and 3A to 3G, various operations for the OTP latch circuit 200 of FIG. 2 will now be described with reference to FIGS. 4 to 7.

Figure 4:
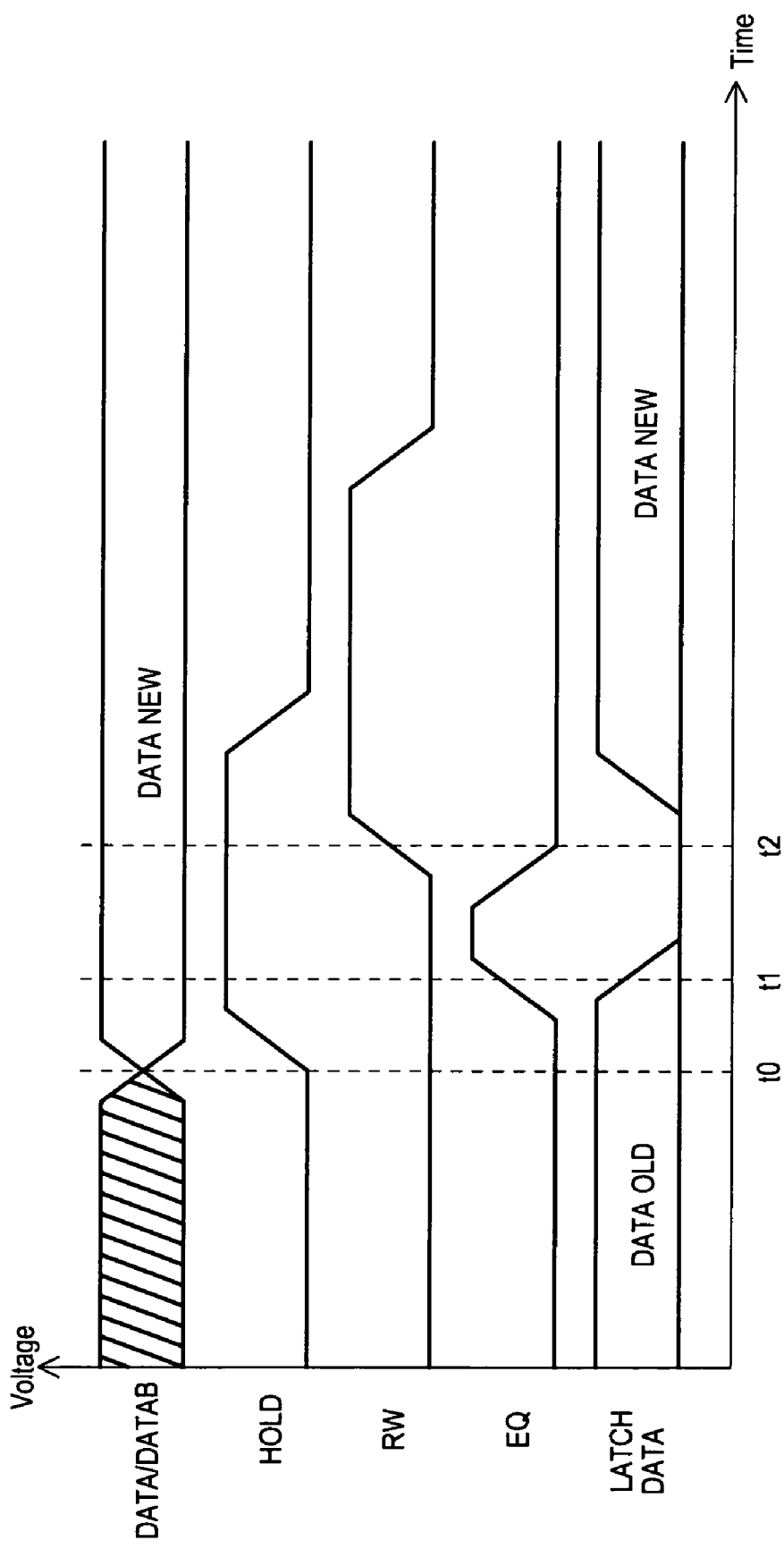
FIG. 4 is a timing diagram showing a data write operation for the circuit of FIG. 2.

FIG. 4 is a timing diagram showing a data write operation for an OTP latch circuit 200. FIG. 4 includes waveforms for a complementary write data value DATA/DATAB that can be presented complementary bitlines, a HOLD signal for controlling latching operations, a read/write signal RW that can enable pass devices coupled to bitlines, an equalization signal EQ that can equalize nodes of a latch, and a LATCH DATA signal representing a data value latched.

At time t0 a write data value can be presented on the bits lines. At about this same time a HOLD signal can be driven inactive (high in this example), disabling hold devices P3/P4 within latch section 202 to allow a latched state to be easily changed. A RW signal can be inactive (low in this example), which can keep pass devices 234 and 238 off, isolating latch section 202 from the write data DATA/DATAB. An equalization signal EQ can also be inactive, keeping latch nodes at differential potentials. Data latched LATCH DATA can remain at a previously established value.

At about time t1, an equalization signal EQ can go active (high in this example). As a result, equalization devices N3/N4 can turn on, driving both data nodes (208/210) of latch section 202 low, resulting in LATCH DATA having no established value (both data nodes discharged). At the same time, hold devices P3/P4 remain off, disabling the latching ability of latch section 202, and signal RW remains inactive, continuing to isolate write data from the latch section 202.

Prior to time t2, an equalization signal EQ can return inactive, isolating data nodes (208 and 210) from one another.

At about time t2, a RW signal can be activated (high in this example), enabling pass devices 234 and 238, and causing complementary write data DATA/DATAB to be driven at data nodes (208 and 210). This can result in latch circuit 202 receiving the write data value.

Subsequently, signal HOLD can return to an active state, enabling hold devices P3/P4, and thus causing latch section 202 to latch the write data.

It is noted that in a write operation, various other signals of FIG. 2, including a high voltage bias signal HVB, a read OTP element signal RDOTP, a program enable signal PRGEN can remain low. At the same time, a programming voltage Vpp can be at a high voltage that is less than a programming voltage (e.g., a high supply voltage VPWR).

In this way, data can be written to an OTP latch circuit 200.

Figure 5:
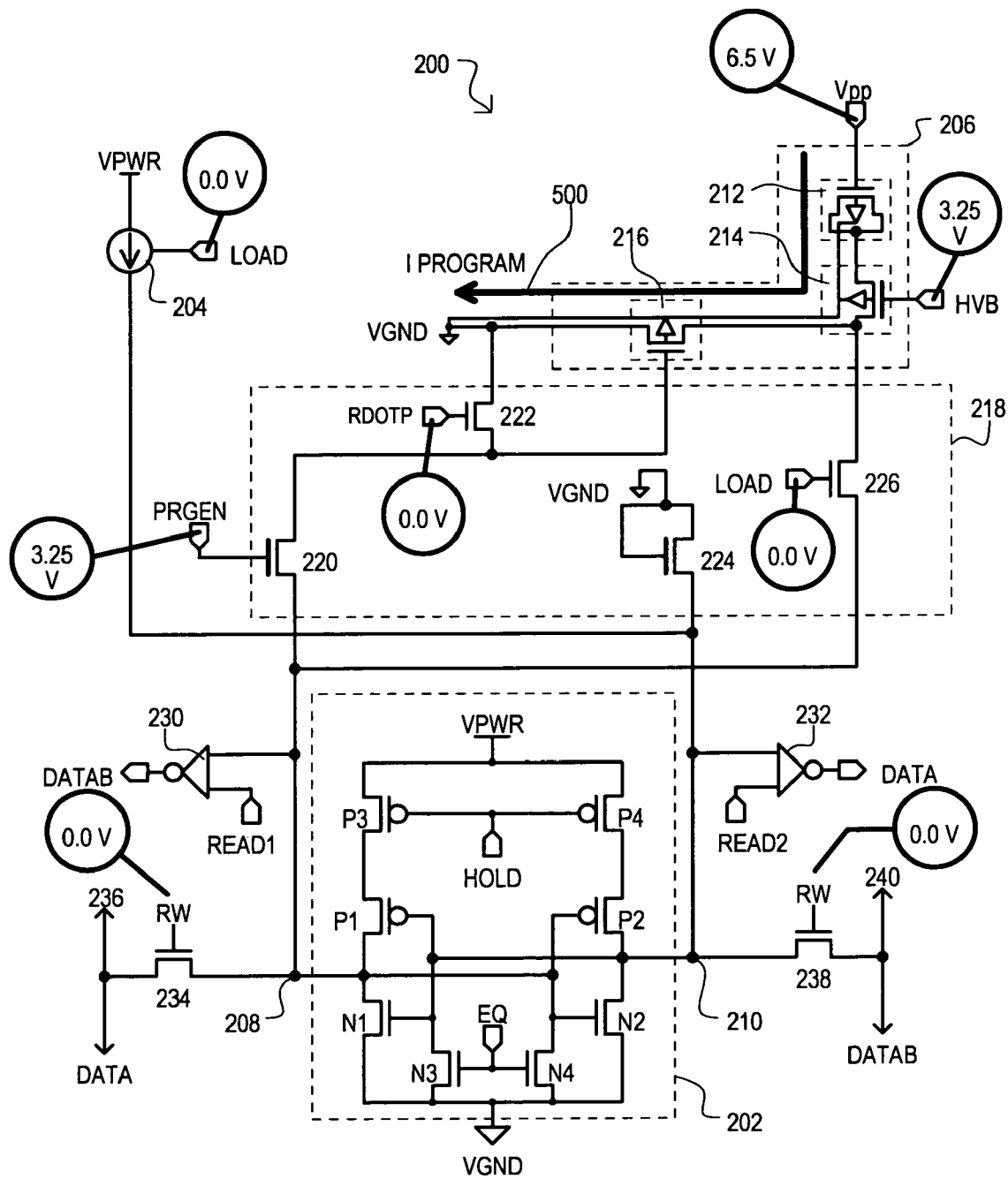
FIG. 5 is a schematic diagram illustrating a program operation for the circuit of FIG. 2.

Referring now to FIG. 5, the same circuit of FIG. 2 is shown with signal levels utilized in an example programming operation. A programming operation can set a state of OTP device 212 according to data latched within latch section 202. More particularly, in the event a latch section 202 stores one value (node 208 high, node 210 low), an insulator (oxide) of GOAF device 212 can be ruptured, thereby creating a resistive short through GOAF device 212. In the event a latch circuit 202 stores a complementary value (node 210 high, node 208 low), a GOAF device 212 can remain in an unprogrammed state, thus, an insulator (oxide) of GOAF device 212 can be remain intact, and draw essentially no current.

In the example a program operation shown in FIG. 5, it is assumed that a latch section 202 can store a data value that results in GOAF device 212 being programmed (node 208 high, node 210 low).

Referring to FIG. 5, within latch section 202, a HOLD signal can be active, enabling regeneration. Equalization signal EQ can be inactive. Further, RW signal can be inactive isolating bitlines (236 and 240) from latch section 202.

Within OTP circuit 206, a GOAF device 212 can receive a pulsed programming voltage Vpp at its gate. In the particular example shown, it is assumed GOAF device 212 has about a 20 angstrom oxide thickness and a pulsed Vpp voltage is about 6.5 volts. A high voltage transistor 214 can receive an active high voltage signal HVB. Such a signal can allow a source/drain of GOAF device 212 to be pulled to a lower voltage, in the event programming is to take place. At the same time, such a device can isolate latch section 202 from the relatively high programming voltage Vpp. In the particular example shown, an HVB signal can be driven to about 3.25 volts.

Within load/program circuit 218, a program enable device 220 can receive a high voltage program enable signal PRGEN, and thus connect a data value stored in latch section 202 to a gate of programming device 216 within OTP circuit 206. In this way, if node 208 is high, programming device 216 can enable a programming path to VGND. In the particular operation shown, a high voltage program enable signal PRGEN can be about 3.25 volts. At the same time, a read OTP device 222 can receive a RDOTP signal at an inactive level, and can be turned off. In addition, a LOAD signal can be inactive, turning off load device 226 as well as current reference circuit 204.

Under such conditions, a GOAF OTP device 212 can be programmed to create a programming current, shown by arrow 500. In this way, an OTP latch circuit 200 can be one time programmed to retain a particular data value.

Figure 6:
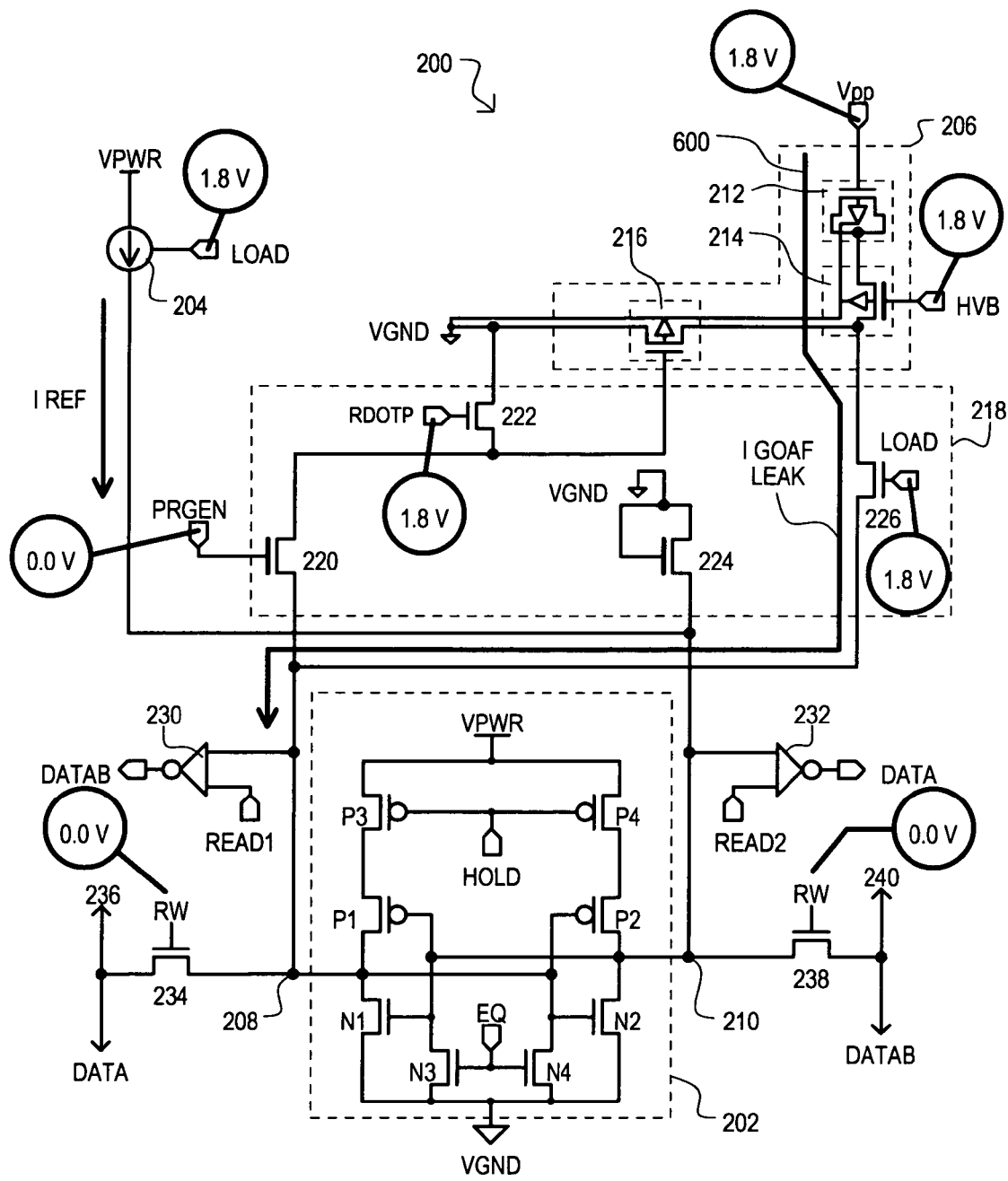
FIG. 6 is a schematic diagram illustrating a data load operation for the circuit of FIG. 2.

Referring now to FIG. 6, the same circuit of FIG. 2 is shown with signal levels utilized in a load operation. A load operation can set the state of latch section 202 according to a state of OTP device 212. More particularly, in the event OTP device 212 is programmed (i.e., draws a current), a latch section 202 can be set to store one value (node 208 high, node 210 low). Conversely, in the event OTP device 212 is not programmed (i.e., draws essentially no current), a latch section 202 can be set to store an opposite value (node 208 low, node 210 high).

In the following description it will be assumed that OTP device 212 is programmed. Within OTP circuit 206, a GOAF device 212 can receive a high voltage at its gate. In the particular example shown, a high voltage can be a high power supply voltage of about 1.8 volts. A high voltage transistor 214 can also receive a similar high supply voltage of about 1.8 volts. As a result, a current path can be enabled through GOAF device 212 and high voltage transistor 214.

Within load/program circuit 218, a program enable device 220 can receive an inactive (low) program enable signal PRGEN. A LOAD signal can be high, providing a current a path from OTP circuit 206 to node 208, and another current path from reference current circuit 204 to node 210. As will be recalled, when OTP device 212 is programmed, a leakage (i.e., charging) current to node 208 can be greater than a reference current to node 210. When OTP device 212 is not programmed, a leakage current to node 208 can be less than a reference current to node 210. Thus, according to a programmed state of OTP device 212, a potential between nodes 208 and 210 can differ and ultimately be latched.

Within latch section 202, equalization devices N3/N4 can be initially enabled while hold devices P3/P4 are disabled. Once a sufficient differential voltage is developed between nodes 208 and 210, equalization devices N3/N4 can be disabled and hold devices P3/P4 can be enabled, thus latching a data value based on a state of the OTP device 212.

Figure 7:
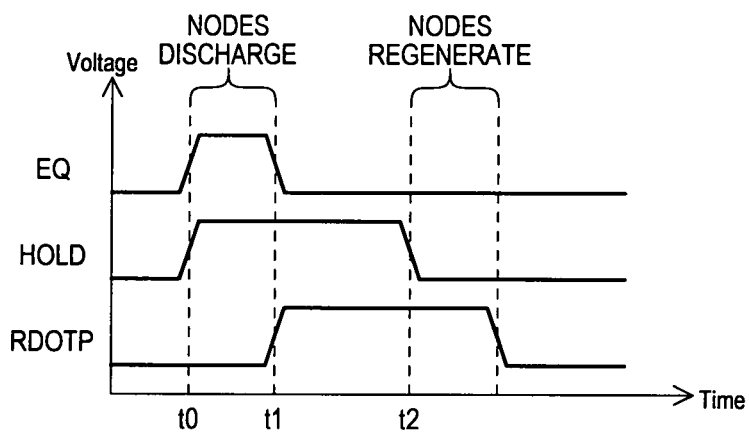
FIG. 7 is a timing diagram further showing data load operation for the circuit of FIG. 2.

One example of timing signals for such a load operation is shown in FIG. 7.

FIG. 7 is a timing diagram showing equalization signal EQ, hold signal HOLD, and OTP read signal RDOTP. At about time t0, signal EQ can go high, enabling equalization devices N3/N4, while signal HOLD can be high, turning off hold devices P3/P4. This can result in nodes 208 and 210 of latch section 202 being discharged to ground (VGND).

At about time t1, signal EQ can return to a low level, resulting in data nodes 208 and 210 being isolated from one another. At this time, nodes 208 and 210 can be driven to different potentials based on a programmed state of OTP device 212. In addition, signal RDOTP can go active, disabling a programming path for OTP circuit 206. It is noted that a signal LOAD is also enabled after signal RDOTP goes active.

At about time t2, signal HOLD can return to a low level, enabling hold devices P3/P4 and thus enabling the latching function of latch section 202. Data can thus be latched representing the OTP device 212.

In this way, an OTP latch circuit 200 can be programmed. The leakage path for a programmed OTP device 212 is shown by arrow 600.

Figures 8A, 8B, 8C:
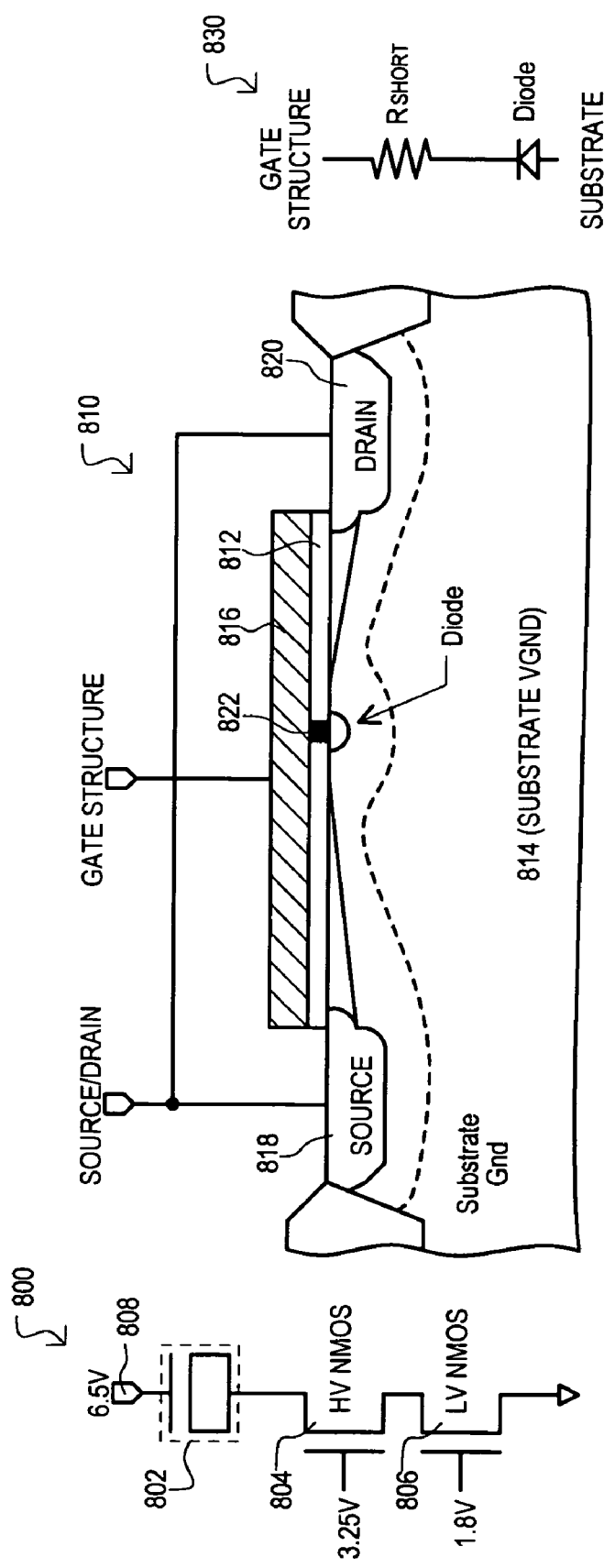
FIG. 8A is a schematic diagram of a 3 transistor (3T) gate oxide antifuse (GOAF) circuit that can be utilized in the embodiments of the present invention.
FIG. 8B is a side cross sectional layout/process view of a GOAF device.
FIG. 8C is a schematic diagram representing a first order model for a GOAF device.

Referring now to FIGS. 8A to 8C a more detailed description of a 3T GOAF circuit will be given. Such a circuit can be considered related to the above embodiments, in that such a circuit can be used as an OTP circuit. FIG. 8A shows a schematic diagram of a 3T GOAF circuit 800. The particular 3T GOAF circuit 800 shown can include a GOAF device 802, a high voltage NFET(NMOS) 804, and a low voltage NFET(NMOS) 806. A GOAF device 802 can have a gate structure coupled to a program node 808 and source/drain structures commonly connected to a drain of a high voltage NFET(NMOS) 804. A high voltage NFET(NMOS) 804 can be a high voltage device capable of withstanding a higher voltage difference between its gate and drain/source than the majority of other transistors. A high voltage NFET(NMOS) 804 can have a source connected to a drain of a low voltage NFET(NMOS) 806. Low voltage NFET(NMOS) 806 can have a source connected to a low supply voltage VGND.

FIG. 8A shows a very particular example of high voltage levels that can be received at the gates (gate structures) of the various devices. Thus, a program node 808 can receive a signal that can be as high as 6.5 volts. A gate of high voltage NFET(NMOS) 804 can receive a signal that can be as high as 3.25 volts. Finally, a gate of low voltage NFET (NMOS) 806 can receive a signal that can be as high as 1.8 volts.

FIG. 8B shows a side cross sectional view of a GOAF device according to one embodiment. A GOAF device 810 can have the same general structure as an NFET(NMOS), including a gate insulator 812 formed on a p-doped a substrate 814, and a gate structure 816 formed over gate insulator (e.g., oxide) 812. In addition, an N-doped source 818 and an N-doped drain 820 can be formed in substrate 814. N-doped source 818 and drain 820 can be commonly connected to one another.

As is well understood, as a high voltage is applied between a gate structure 816 and source/drain 818/820, a gate insulator 812 can breakdown at a weak point due to charge trapping and percolation. Current density at the breakdown point can result in a localized high temperature, which can create a silicon filament (shown as 822) that connects a gate structure 812 and substrate 814. The creation of such a filament (e.g., 822) can form a diode like structure, which acts like a transistor with a saturated drain.

FIG. 8C shows a representative model of a programmed GOAF device. Thus, a GOAF device model 830 can include a resistor $R_{SHORT}$ as well as a diode.

Figure 9:
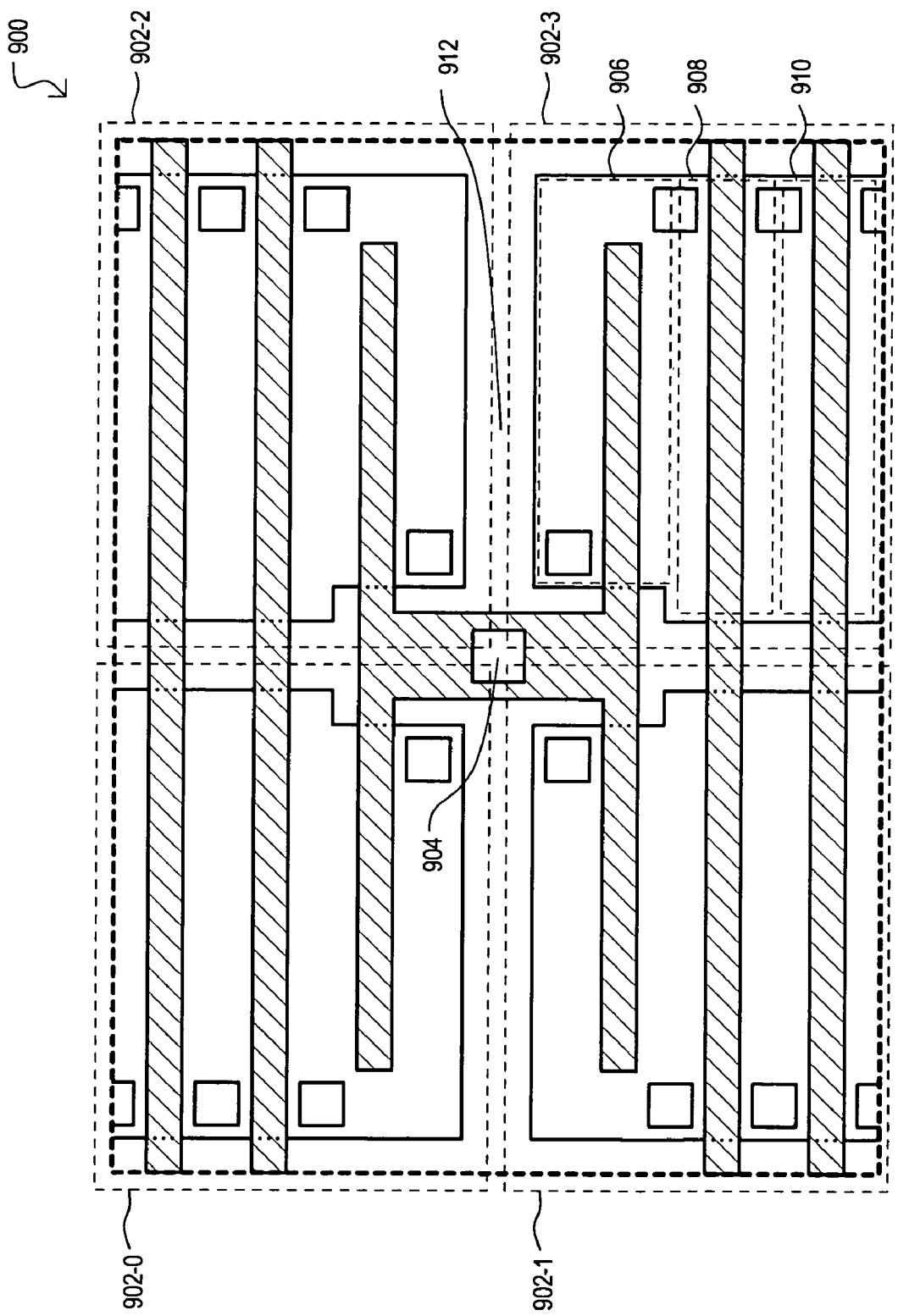
FIG. 9 is a top layout view of four 3T GOAF circuits according to one embodiment.
Figure 11:
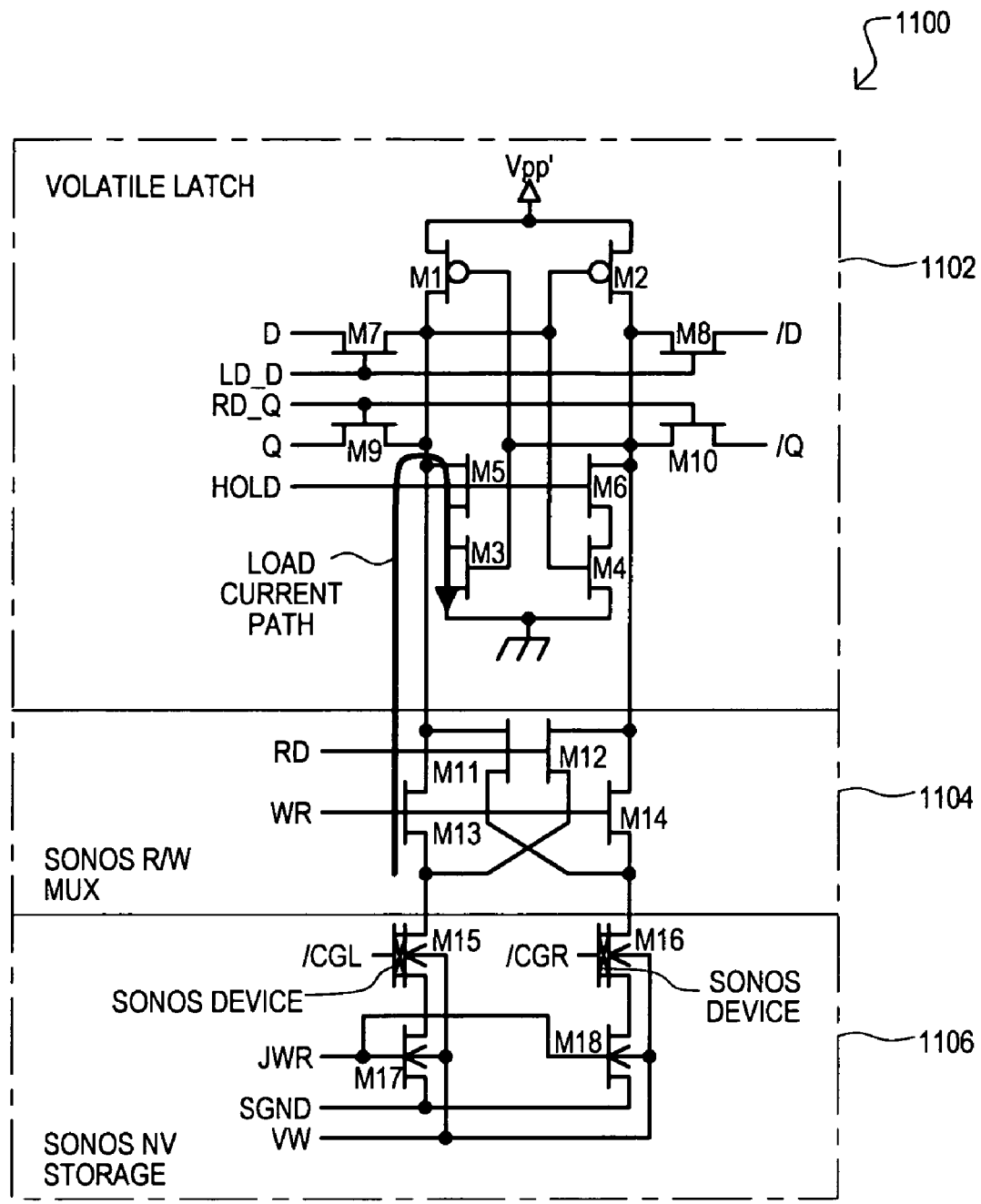
FIG. 11 is a schematic diagram of a conventional programmable latch circuit that utilizes silicon-oxide-nitride-oxide-silicon (SONOS) type storage elements.

Referring now to FIG. 9, a sample layout for 3T GOAF circuits is set forth in a top plan view. FIG. 9 can be considered related to the above embodiments as it represents one possible layout arrangement that can be used in conjunction with the above circuits.

Layout 900 illustrates four 3T GOAF circuits 902-0 to 902-3 mirrored about a common Vpp contact 904. Each GOAF circuit (902-0 to 902-3) can include a GOAF device 906, high voltage transistor 908, and low voltage transistor 910 (shown only for GOAF circuit 902-3). Hatching structures can be a polysilicon gate layer formed over active regions separated form one another by isolation 912.

According to well understood techniques, devices 906 and transistors 908 and 910 can be formed with polysilicon gates separated from a substrate by a gate oxide. Devices 906 and 908 can be high voltage devices with a thicker gate oxide and/or specialized doping.

Figure 12:
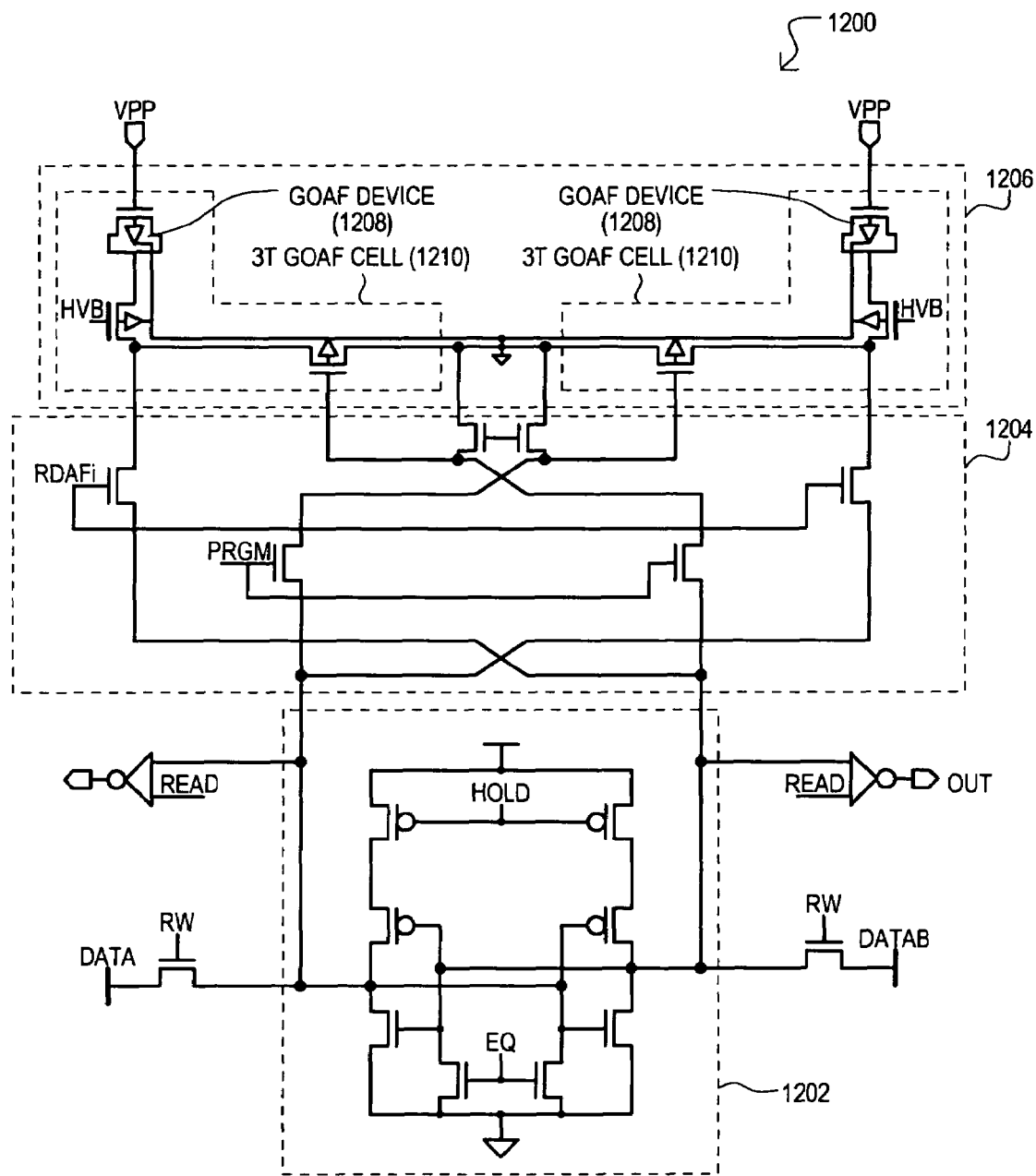
FIG. 12 is a schematic diagram of an OTP latch circuit that utilizes multiple GOAF devices.

It is understood that in a conventional approach, like that of FIG. 12, a layout 900 could serve for only two OTP latch circuits, if redundancy is not used, or for only one OTP latch circuit if redundancy is employed. In sharp contrast, when a layout 900 is used in an OTP latch circuit according to the above embodiments, such a layout can serve four OTP latch circuits if redundancy is not used, or two OTP latch circuit if redundancy is used.

In this way, the various embodiments can provide substantial reduction in circuit size over conventional approaches like that of FIG. 12.

Figure 10:
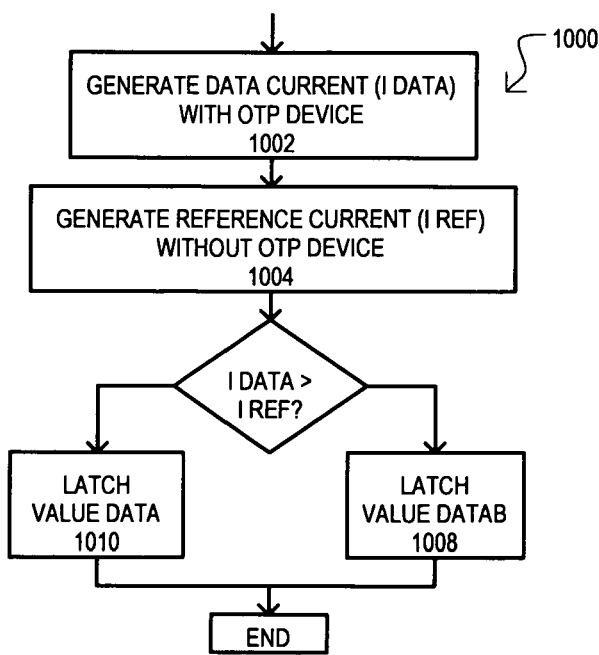
FIG. 10 is a flow diagram of a method according to another embodiment of the present invention.

Referring now to FIG. 10, a method of programming/operating an OTP latch circuit will now be described. The embodiment of FIG. 10 can be considered related to the above embodiments in that such a method can be performed by such circuits.

FIG. 10 shows a flow diagram of a method 1000 that includes generating a data current $I_{DATA}$ with an OTP device (step 1002). The method further includes generating a reference current $I_{REF}$ without an OTP device (step 1004). In the event the data current $I_{DATA}$ is greater than the reference current $I_{REF}$ (Y from 1006) one data value DATA can be latched (step 1008). In the event the data current $I_{DATA}$ is not than the reference current $I_{REF}$ (N from 1006) a complementary data value DATAB can be latched (step 1010).

Accordingly, the various embodiments can represent an improvement over conventional solutions, as only one OTP device can be used to store a logic state in a nonvolatile fashion (as opposed to two). Further, only one additional OTP device need be added in the event redundancy is desired (as opposed to having to add two such devices).

A further advantage can be improved overall programming yield. In a conventional approach like that of FIG. 12, loading a data value from OTP devices can depend upon leakage current in one of two OTP devices. That is, at least one OTP device would always have to be programmed for all such circuits. In contrast, the above embodiments depend upon programming one device only if dictated by the logic value to be stored.

Still further, the present invention may provide an advantageous degree of adjustability for making load operations more efficient. More particularly, a reference current can be adjusted based on an expected, or actual, GOAF resistance value after programming. This can result in faster and/or more reliable load operations.

It is understood that the embodiments of the invention may be practiced in the absence of an element and or step not specifically disclosed. That is, an inventive feature of the invention can be elimination of an element or step.

Further, for purposes of clarity, many of the details of a OTP latch circuit and operating method that are widely known and are not relevant to the present invention have been omitted from the above description.

It should be appreciated that reference throughout this specification to "one embodiment" or "an embodiment" means that a particular feature, structure or characteristic is described in connection with the embodiment is included in at least one embodiment of the present invention. Therefore, it is emphasized that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present invention.

Similarly, while the various aspects of the particular embodiments set forth herein have been described in detail, the present invention could be subject to various changes, substitutions, and alterations without departing from the spirit and scope of the invention.

What is claimed is:

1. A programmable latch circuit, comprising:
   a one-time programmable (OTP) device capable of being programmed only once to store a logic value;
   a current source that provides a current reference not generated according to a state of any OTP device; and
   a store circuit that stores a predetermined logic value based on a comparison between a current drawn in response to the OTP device and the reference current, the store circuit including a latch circuit that stores the predetermined logic value and includes at least two latch nodes that store complementary logic values, and a pass device coupled to at least one of the latch nodes that provides a path for writing data to the latch circuit.

2. The programmable latch circuit of claim 1, wherein: the OTP device comprises a gate oxide anti-fuse device.

3. The programmable latch circuit of claim 1, wherein: the store circuit further includes
   a read out amplifier coupled to at least one of the latch nodes that amplifies the logic value thereon.

4. The programmable latch circuit of claim 1, wherein: the current source is selected from the group consisting of:
   a transistor pair that includes a first transistor in series with a second transistor, the first transistor being coupled to a power supply and the second transistor being enabled by a load signal that is active when a data value is loaded from the OTP device,
   a transistor pair that includes a first transistor in series with a second transistor, the first transistor being coupled to a bias voltage at a level between power supply voltages, the second transistor being enabled by a load signal that is active when a data value is loaded from the OTP device,
   a current mirror having a load transistor coupled in series with one of the current mirror legs, the load transistor being enabled by a load signal that is active when a data value is loaded from the OTP device,
   a current mirror having load transistors coupled in series with both of the current mirror legs, the load transistors being enabled by a load signal that is active when a data value is loaded from the OTP device, and
   a resistor in series with a load transistor, the load transistor being enabled by a load signal that is active when a data value is loaded from the OTP device control.

5. The programmable latch circuit of claim 1, further including:
the current source and the store circuit comprise insulated gate field effect transistors; and
an OTP circuit that includes the OTP device and at least a high voltage transistor, the high voltage transistor including a gate insulator that is more resistant to high voltage breakdown than the transistors of the current source and store circuit.

6. The programmable latch circuit of claim 5, wherein:
the OTP circuit includes the OTP device, the high voltage transistor, and a programming transistor, a source-drain path of the high voltage transistor being coupled between the OTP device and one of the latch nodes, a source-drain path of the programming transistor being coupled between the high voltage transistor and a low power supply voltage.

7. The programmable latch circuit of claim 1, further including:
a redundant OTP (R-OTP) device capable of being programmed only once to store a logic value, the R-OTP device being arranged in parallel with the OTP device, and not being programmed to match the state of the OTP device if the OTP device is not defective.

8. A one time programmable latch, comprising:
a latch circuit having cross-coupled data nodes that store a logic value;
a current source circuit coupled to a first data node that supplies a first current to a first data node in response to a load signal, the first current value not controlled according to any nonvolatile storage device;
a one time programmable (OTP) device that draws essentially no current in a first state and a leakage current in the second state, the OTP device being coupled to a second data node in response to the load signal; and
a high voltage transistor having a source-drain path coupled between the OTP device and the second data node.

9. The one time programmable latch of claim 8, wherein:
the latch circuit comprises
a pair of latch transistors cross-coupled between the data nodes, and
a pair of hold transistors, a first hold transistor having a source-drain path coupled between a first data node and a first supply voltage, a second hold transistor having a source-drain path coupled between a second data node and the first supply voltage, the gate of the first and second hold transistors being commonly coupled to receive a hold signal.

10. The one time programmable latch of claim 9, wherein:
the latch circuit further includes
a pair of equalization transistor, a first equalization transistor having a source-drain path coupled between the first data node and a second supply voltage, a second equalization transistor having a source-drain path coupled between the second data node and the second supply voltage, the gate of the first and second equalization transistors being commonly coupled to receive an equalization signal.

11. The one time programmable latch of claim 8, further including:
a programming transistor having a source-drain path coupled between the high voltage transistor and a second supply voltage, and gate coupled to one of the data nodes.

12. The one time programmable latch of claim 11, further including:
a program enable transistor having a source-drain path coupled between the gate of the programming transistor and the one of the data nodes.

13. The one time programmable latch of claim 8, further including:
an OTP load transistor having a source-drain path coupled between the OTP device and the second data node;
a current source load transistor having a source-drain path coupled between the current source circuit and the first data node; wherein
the gates of the OTP load transistor and current source load transistor are commonly coupled to receive a load signal.

14. A method of programmable latching, comprising the steps of:
establishing a state of a one time programmable (OTP) device to provide a programmed current value representing a predetermined logic value;
providing a reference current that is not generated from an OTP device
latching a data value based on a difference between the programmed current and the reference current; and
when programming one state of the OTP device, enabling a programming potential to the OTP device when the latch stores a particular data value.

15. The method of programmable latching of claim 14, wherein:
establishing the state of the OTP device includes,
to store one logic value, creating a short in an insulator of a gate oxide antifuse device that draws a leakage current, and
to store another logic value, not altering the gate insulator of the gate oxide antifuse device to draw essentially no current with the gate oxide antifuse device.

16. The method of programmable latching of claim 15, wherein:
the reference current is less than the leakage current.

17. The method of programmable latching of claim 14, wherein:
providing the reference current includes biasing a current supply transistor.

18. The method of programmable latching of claim 13, further including:
when programming one state of the OTP device,
also writing one data value to a latch.

19. The method of programmable latching of claim 13, wherein:
providing the reference current includes generating the reference current from a digital value.

* * * * *

UNITED STATES PATENT AND TRADEMARK OFFICE
CERTIFICATE OF CORRECTION

| | |
|---|---|
| PATENT NO. | : 7,342,836 B2 |
| APPLICATION NO. | : 11/234429 |
| DATED | : March 11, 2008 |
| INVENTOR(S) | : Babak Taheri and Sanjeev Maheshwari |

Page 1 of 1

It is certified that error appears in the above-identified patent and that said Letters Patent is hereby corrected as shown below:

At column 16, line 50, Claim 18, please replace claim dependency number "13" with "14" so that the Claim 18 is dependent on independent Claim 14.

At column 16, line 54, Claim 19, please replace claim dependency number "13" with "14" so that the Claim 19 is dependent on independent Claim 14.

Signed and Sealed this

Fourteenth Day of October, 2008

JON W. DUDAS
*Director of the United States Patent and Trademark Office*